(12) United States Patent
Subbloie

(10) Patent No.: US 11,689,051 B2
(45) Date of Patent: *Jun. 27, 2023

(54) THIRD PARTY ENERGY MANAGEMENT

(71) Applicant: Albert Subbloie, Orange, CT (US)

(72) Inventor: Albert Subbloie, Orange, CT (US)

(73) Assignee: Budderfly, Inc., Shelton, CT (US)

( * ) Notice: Subject to any disclaimer, the term of this patent is extended or adjusted under 35 U.S.C. 154(b) by 280 days.

This patent is subject to a terminal disclaimer.

(21) Appl. No.: 17/143,637

(22) Filed: Jan. 7, 2021

(65) Prior Publication Data

US 2021/0126459 A1 Apr. 29, 2021

Related U.S. Application Data

(63) Continuation of application No. 15/910,715, filed on Mar. 2, 2018, now Pat. No. 10,916,968.

(Continued)

(51) Int. Cl.
*H02J 13/00* (2006.01)
*H02J 3/14* (2006.01)
(Continued)

(52) U.S. Cl.
CPC ...... *H02J 13/00007* (2020.01); *G01R 22/063* (2013.01); *G05F 1/66* (2013.01); *G06Q 50/06* (2013.01); *H02J 3/14* (2013.01); *H02J 3/38* (2013.01); *H02J 3/381* (2013.01); *H02J 13/00004* (2020.01); *H02J 13/00022* (2020.01); *H02J 13/00026* (2020.01); *H02J 13/00028* (2020.01); *H04W 24/00* (2013.01); *G05B 15/02* (2013.01); *G05B 2219/2642* (2013.01); *H02J 3/32* (2013.01); *H02J 2300/24* (2020.01); *H02J 2300/28* (2020.01)

(58) Field of Classification Search
CPC ... G05B 15/02; G05B 2219/2642; G05F 1/66; G06Q 50/06; G01R 22/063; H02J 3/14; H02J 3/32; H02J 3/38; H02J 3/381; H02J 13/00004; H02J 13/00007; H02J 13/00022; H02J 13/00026; H02J 13/00028; H02J 2300/24; H02J 2300/28; H04W 24/00
See application file for complete search history.

(56) References Cited

U.S. PATENT DOCUMENTS 7,135,956 B2 11/2006 Bartone et al.
8,103,465 B2 1/2012 Brzezowski et al.
(Continued)

OTHER PUBLICATIONS

Mohamed A. Ahmed, et al., "Communication Network Architectures for Smart-House with Renewable Energy Resources", Energies 2015, Published: Aug. 17, 2015, 8, 8716-8735.
(Continued)

*Primary Examiner* — Crystal J Barnes-Bullock
(74) *Attorney, Agent, or Firm* — St. Onge Steward Johnston & Reens LLC

(57) ABSTRACT

A system of modules which control and measure energy usage at a building which are in communication with a software program executing on a remote server controlled by a third party. The third party said usage via the software program which communicates with the modules to modify energy usage and demand for energy and is responsible or liable for energy usage charges the building where the third party does not actually use the energy.

21 Claims, 4 Drawing Sheets

Related U.S. Application Data

(60) Provisional application No. 62/546,624, filed on Aug. 17, 2017.

(51) Int. Cl.
*G01R 22/06* (2006.01)
*G06Q 50/06* (2012.01)
*G05F 1/66* (2006.01)
*H04W 24/00* (2009.01)
*H02J 3/38* (2006.01)
*H02J 3/32* (2006.01)
*G05B 15/02* (2006.01)

(56) References Cited

U.S. PATENT DOCUMENTS

| | | | |
|---|---|---|---|
| 8,335,596 B2 | 12/2012 | Raman et al. | |
| 8,676,389 B2 | 3/2014 | Golden et al. | |
| 8,682,491 B2 | 3/2014 | Fakos et al. | |
| 8,849,715 B2 | 9/2014 | Forbes, Jr. | |
| 8,903,560 B2 | 12/2014 | Miller | |
| 9,026,261 B2 * | 5/2015 | Bukhin | G06F 1/3234 700/298 |
| 10,916,968 B2 * | 2/2021 | Subbloie | H02J 13/00026 |
| 11,282,150 B2 * | 3/2022 | Matsuoka | F24F 11/64 |
| 11,308,508 B2 * | 4/2022 | Matsuoka | G06Q 50/06 |
| 2004/0078153 A1 | 4/2004 | Bartone et al. | |
| 2009/0305644 A1 | 12/2009 | Rhee et al. | |
| 2010/0179704 A1 | 7/2010 | Ozog | |
| 2011/0093127 A1 | 4/2011 | Kaplan | |
| 2011/0231320 A1 | 9/2011 | Irving | |
| 2012/0239219 A1 | 9/2012 | Forbes, Jr. | |
| 2012/0290144 A1 | 11/2012 | Yuasa et al. | |
| 2012/0296799 A1 | 11/2012 | Playfair et al. | |
| 2014/0174080 A1 | 6/2014 | Friesth | |
| 2014/0379156 A1 | 12/2014 | Kamel et al. | |
| 2015/0012146 A1 | 1/2015 | Cherian et al. | |
| 2015/0142193 A1 | 5/2015 | Golden et al. | |
| 2016/0004290 A1 * | 1/2016 | Bukhin | H02J 13/00004 700/291 |
| 2016/0033986 A1 | 2/2016 | Kamel et al. | |
| 2016/0241036 A1 | 8/2016 | Wolter | |
| 2016/0329710 A1 | 11/2016 | Clifton | |
| 2017/0069008 A1 | 3/2017 | Wang et al. | |
| 2017/0077751 A1 | 3/2017 | Forbes, Jr. | |
| 2017/0083989 A1 | 3/2017 | Brockman et al. | |
| 2017/0116688 A1 | 4/2017 | Ahn et al. | |
| 2018/0366953 A1 | 12/2018 | DeTommasi et al. | |

OTHER PUBLICATIONS

Nencong Su, et al., "Energy Management Systems in Microgrid Operations", Oct. 2012, vol. 25, Issue 8, 2012, © Elsevier Inc. All rights reserved.

* cited by examiner

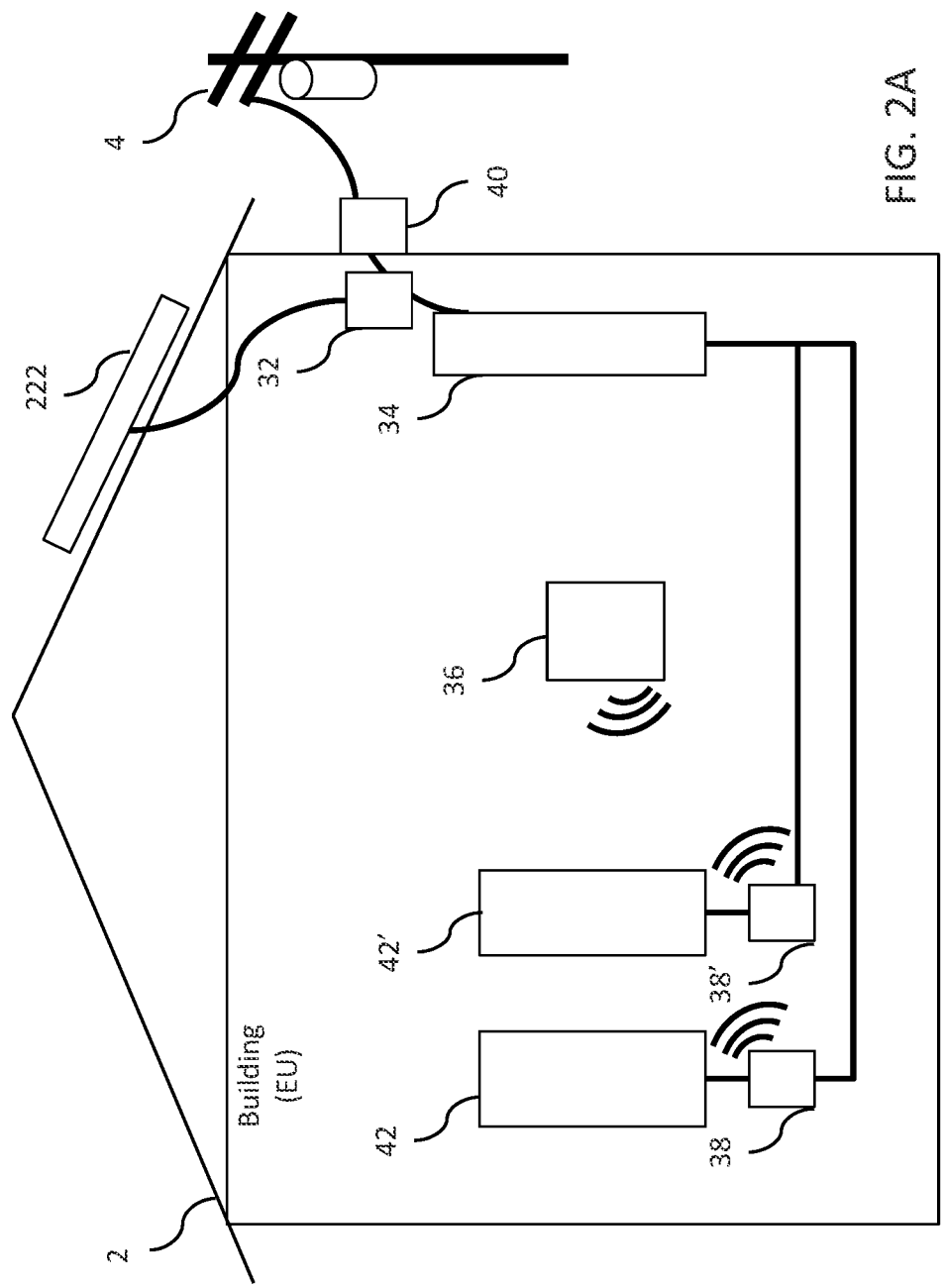

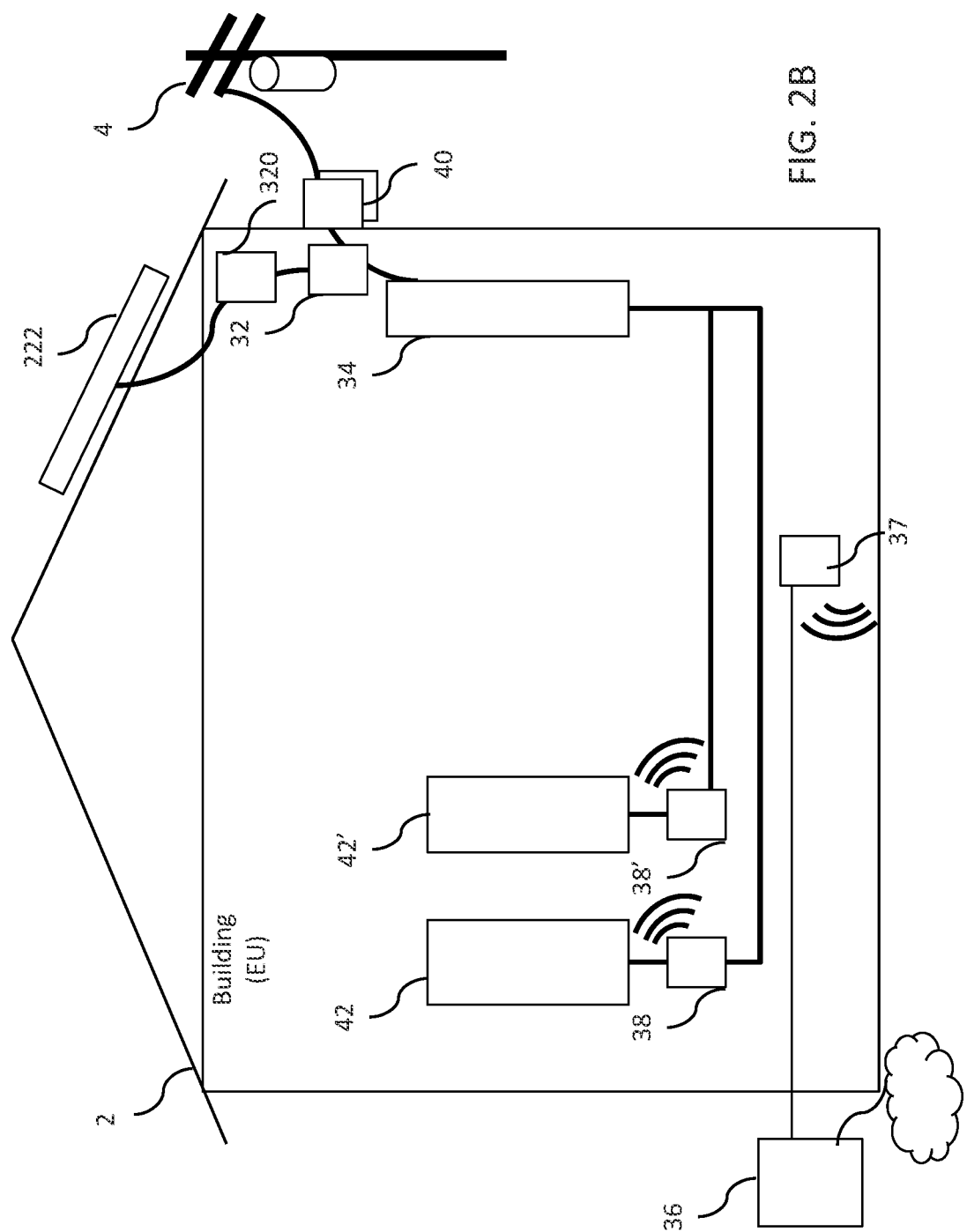

THIRD PARTY ENERGY MANAGEMENT

FIELD OF THE INVENTION

The following relates to management and reduction of energy consumption.

BACKGROUND OF THE INVENTION

The management and control of energy usage and related services is often fragmented and difficult for commercial establishments to manage. Moreover, these entities often need to expend significant capital to install energy efficient upgrades or smart energy control devices. Once installed in the existing model, these entities then need to internally manage the upgrades and devices to see a significant return on the reduction of energy expenses. The actual performance is very difficult to measure, as few solutions exist today that provide a real time measurement capability granular enough for effective management. In most every scenario, the measurement, control and management of energy consumption is not the main task the business is concerned with and energy management does not usually fall within the expertise of the business entity. Rather, the business is concerned with producing products, selling products/services and/or servicing customers. With the fragmented nature of energy efficiency providers the business would need to engage with multiple suppliers and then manage the devices installed by those suppliers on their own. Most of these multi supplier solutions are not integrated. Therefore, to effectively implement any energy solutions, the business would need to expend significant resources hiring personnel and building integration between a variety of disparate systems to manage these operations effectively.

More recently, there has been a significant expansion in the availability of IoT (Internet of Things) devices that are considered "smart" because they can be controlled remotely, i.e. via a network connection such as the internet or a cellular device. The difficulty again with these devices is that they represent another fragmented set of devices that are not well integrated and furthermore require the company using the energy to install and manage the devices in an efficient way, which is often not practical or possible. Furthermore, these devices do not integrate well with the decision process as to when to use renewable v. utility supplier power and how and when the utility supplier charges for energy usage, including complex demand charge management where, for example, the rate changes based on the peak or maximum energy usage rate during a given time period. Most of these devices are configured to be controlled based on set schedules only without regard to actual usage, time of usage, and concurrent device, upgrade, or equipment usage and demand. Even if these devices offer some individual device level utilization measurement capability, demand peak and peak management metrics are related to the energy utilization of the facility as a whole, and not any single device. Without knowledge of the overall utilization of energy, the control and savings would remain limited.

While there exist some models today where companies can offer to sell and even finance the cost of energy savings equipment, the equipment itself, even if more efficient, only leads to partial gains. For example, while a more efficient LED light can save costs and usage compared to an incandescent or halogen light, controls which turn these on/off when presence is detected or after hours can add substantial savings. The same principle applies to heating and cooling.

However, as described above, the business using the energy is generally not in the business of managing their energy usage and it may not be effective or efficient for that business to implement a system to control their energy usage. At the same time, this business does want to save money on electricity costs because doing so will positively impact profitability.

Therefore, a need exists for an integrated energy usage measurement, management and control solution which results in reduced energy usage.

SUMMARY OF THE INVENTION

Therefore, it is an object of the present invention to provide improved energy usage controls via networked modules which are configured to measure, monitor and control energy usage on a granular level.

It is a further object of the present invention to reduce energy usage, carbon emissions, and expense of operating buildings and facilities.

It is a further object of the present invention to provide for a third party to be responsible for monitoring the measurement of energy upgrades and devices, while implementing control commands and further being responsible for payment of bills from Utilities resulting from building usage of energy from an energy supplier. In preferred embodiments, this third party is different than the entity actually using or supplying the energy.

It is a further object of the present invention to aggregate the total spend for energy usage and control for multiple buildings and entities to provide for reduced energy usage and expenditures and/or rates and charges.

In contrast to existing approaches where companies can offer to sell and even finance the cost of energy savings equipment, the equipment itself, even if more efficient, only leads to partial gains. In the proposed approach, Third party energy management, it is the additional savings that can be had through the smart control and management of devices, not just the simple installation of said devices. This is what leads to a unique approach in energy management. Furthermore, the customer is charged a rate by the entity responsible for controlling usage that is not actually based on actual usage for particular time period. Meaning, the actual user's customer's charge for a given month of electricity usage is not based on the KWh of electricity used for that particular month. This departs from the traditional way in which utilities are billed for, especially electrical utilities, which are often based on KWh and some based on peak demand charges, all of the foregoing relate to actual usage for a given time period.

While traditional energy management may be accomplished with a more efficient LED light, controls which turn these on/off when presence is detected or adjust brightness to match natural daylight conditions, or force them to automatically turn off after hours are all elements that can save substantially more than just the installation of these devices. The same formulas apply to heating, cooling and other energy usage devices.

Other models offer financing possibilities to companies and are known as ESCOs (energy services companies). Many of these companies can help a company finance the cost of adding upgrades, and serve as a way to facilitate the installation and use of more efficient equipment. This financing is supported though the assumed savings of energy of these devices. Some providers may even guarantee some measure of savings and base their rates or fees on these savings. However, as described above, the ESCO only increases efficiency through improved equipment rather than also taking responsibility for the control. Furthermore, if the customer takes the capital expense of upgraded equipment and if usage is not reduced, the ESCO is not responsible for paying for a usage charge because the ESCO has no responsibility other than installing more efficient devices.

The term "data" as used herein means any indicia, signals, marks, symbols, domains, symbol sets, representations, and any other physical form or forms representing information, whether permanent or temporary, whether visible, audible, acoustic, electric, magnetic, electromagnetic or otherwise manifested. The term "data" as used to represent predetermined information in one physical form shall be deemed to encompass any and all representations of the same predetermined information in a different physical form or forms.

The term "network" as used herein includes both networks and internetworks of all kinds, including the Internet, and is not limited to any particular network or inter-network.

The terms "first" and "second" are used to distinguish one element, set, data, object or thing from another, and are not used to designate relative position or arrangement in time.

The terms "coupled", "coupled to", "coupled with", "connected", "connected to", and "connected with" as used herein each mean a relationship between or among two or more devices, apparatus, files, programs, media, components, networks, systems, subsystems, and/or means, constituting any one or more of (a) a connection, whether direct or through one or more other devices, apparatus, files, programs, media, components, networks, systems, subsystems, or means, (b) a communications relationship, whether direct or through one or more other devices, apparatus, files, programs, media, components, networks, systems, subsystems, or means, and/or (c) a functional relationship in which the operation of any one or more devices, apparatus, files, programs, media, components, networks, systems, subsystems, or means depends, in whole or in part, on the operation of any one or more others thereof.

Therefore, the objects described and other objects of the invention are achieved by providing a system of modules which control and measure energy usage at a building which are in communication with a software program executing on a remote server controlled by a third party. The third party is either responsible for paying the bill, or liable for the energy usage of the building and further controls said usage via the software program which communicates with the modules to modify energy usage and demand for energy.

In one aspect a method is provided by which a first entity controls energy usage of a second entity. The method includes one or more of the steps of: installing at a second entity location a plurality of modules each electrically coupled to at least one energy usage device and an electrical power supply from a utility, each module configured to monitor and control energy usage of the electrical power supply by the corresponding at least one energy usage device; connecting the plurality of modules to a network such that the plurality of modules send and receive data via the network from a remote server controlled by the first entity; executing on the remote server a monitoring and control program which sends and receives the data such that data received includes information indicative of electrical power usage of at least one of the plurality of modules and data sent includes information indicative of a control input for at least one of the plurality of modules to remotely modify an energy usage thereof based on the data received; wherein the electrical power supply is obtained by the first entity from the utility and used by the second entity at the second entity location such that the first entity is responsible to pay the bill based on the usage of the second entity, or liable to the utility company for payment of usage of the electrical power supply by the second entity.

In other aspects, a system is provided which enables a first entity to control energy usage of a second entity. The system includes modules installed at a second entity location each electrically coupled to at least one energy usage device and an electrical power supply from a utility. Each module is configured to monitor and control energy usage of the electrical power supply by the corresponding energy usage device. A network is provided and the modules are connected to a remote server controlled by the first entity. The modules send and receive data via the network. Software executes the remote server which sends and receives the data such that data received includes information indicative of electrical power usage of at least one of the plurality of modules and data sent includes information indicative of a control input for at least one of the modules to remotely modify an energy usage thereof based on the data received. Further, the electrical power supply is obtained by the first entity from the utility and used by the second entity at the second entity location such that the first entity is either responsible to pay the bill based on usage of the second entity, or liable to the utility company for payment of usage of the electrical power supply by the second entity.

In other aspects a renewable energy generation source is installed at the second entity location. A controller is configured to switch between the electrical power supply and the renewable energy generation source. Software executing on the remote server sends control instructions to the controller to draw energy from the renewable energy generation source. In other aspects the control instructions result in energy being drawn from both the electrical power supply and the renewable energy generation source. In yet other aspects a second controller is configured to modify use of a combustion based energy source based on instructions from the remote server to reduce use of the combustion based energy source and increase use of said renewable energy generation source.

In other aspects a system which enables a first entity to control energy usage of a second entity is provided. A plurality of modules are installed at a second entity location each of the plurality of modules electrically coupled to at least one energy usage device and an electrical power supply from a utility. Each one of the plurality of modules is configured to monitor and control energy usage of the electrical power supply by the at least one energy usage device to which the one of the plurality of modules is electrically coupled. A network is provided an the plurality of modules are connected to a remote server controlled by the first entity via the network. The plurality of modules send and receive data via the network. Software executes on the remote server which sends and receives the data such that data received includes information indicative of electrical power usage of at least one of the plurality of modules and data sent includes information indicative of a control input for at least one of the plurality of modules to remotely modify electrical energy usage based on the data received such that the first entity controls electrical energy usage of the second entity. The electrical power supply is delivered from the utility and used by said second entity at the second entity location but the first entity is responsible for payment for usage of the electrical power supply by the second entity during a time period and such that the second entity is charged for usage of the electrical power supply during the time period without regard to an amount of usage of the electrical power supply.

In certain aspects a renewable energy generation source is installed at the second entity location and a controller is configured to switch between the electrical power supply and the renewable energy generation source. The software executing on the remote server sends control instructions to the controller to draw energy from the renewable energy generation source. In other aspects the control instructions result in energy being drawn from both the electrical power supply and the renewable energy generation source. In other aspects a second controller is configured to modify use of a combustion based energy source based on instructions from the remote server to reduce use of the combustion based energy source and increase use of said renewable energy generation source.

In certain aspects a method is provided by which a first entity controls energy usage of a second entity. The method may include one or more of the steps of: installing at a second entity location a plurality of modules each electrically coupled to at least one energy usage device and an electrical power supply from a utility, each module configured to monitor and control energy usage of the electrical power supply by the corresponding at least one energy usage device; connecting the plurality of modules to a network such that the plurality of modules send and receive data via the network from a remote server controlled by the first entity; executing on the remote server a monitoring and control program which sends and receives the data such that data received includes information indicative of electrical power usage of at least one of the plurality of modules and data sent includes information indicative of a control input for at least one of the plurality of modules to remotely modify an energy usage thereof based on the data received; the electrical power supply is obtained by the first entity from the utility and used by the second entity at the second entity location such that the first entity is either responsible or is liable to the utility company for payment a bill from said utility for usage during a time period of said electrical power supply by the second entity, the first entity is liable to the second entity for payment of the bill to said utility during the time period and said second entity is liable to pay an amount to the first entity that is determined irrespective of the usage during the time period. The charge determined irrespective of usage during the time period can however be based on historical usage.

In other aspects, a renewable energy generation source is installed at the second entity location. A controller is configured to switch between the electrical power supply and the renewable energy generation source, wherein the software executing on the remote server sends control instructions to the controller to draw energy from said renewable energy generation source. In other aspects, the control instructions result in energy being drawn from both the electrical power supply and the renewable energy generation source. In other aspects, a second controller is configured to modify use of a combustion based energy source based on instructions from the remote server to reduce use of the combustion based energy source and increase use of the renewable energy generation source.

In other aspects a system is provided which enables a first entity to control energy usage of a second entity. A plurality of modules are installed at a second entity location each electrically coupled to at least one energy usage device and an electrical power supply from a utility which is separate and distinct from the first and second entities. Each module is configured to monitor and control energy usage of the electrical power supply by the corresponding at least one energy usage device. A network is provided and the plurality of modules are connected to a remote server controlled by the first entity, the plurality of modules send and receive data via the network. Software executes on the remote server which sends and receives the data such that data received includes information indicative of electrical power usage of at least one of the plurality of modules and data sent includes information indicative of a control input for at least one of the plurality of modules to remotely modify an energy usage thereof based on the data received. The electrical power supply is obtained from the utility and used by the second entity at the second entity location such that said first entity is liable to the second entity for payment to the utility for a bill from the utility for a time period, the bill based on usage of the electrical power supply by the second entity such that the first entity is responsible for payment for usage of the electrical power supply that the first entity does not use but that the first entity controls at least in part.

In certain aspects, the electrical power supply is obtained by the first entity from the utility. In other aspects the second entity is responsible to the first entity for an amount during the time period which is determined irrespective of the usage of the electrical power supply by the second entity. In other aspects, the amount is adjusted based on a charge rate per unit energy. In certain aspects the charge rate per unit energy is measured in $/KWh (dollars per/Kilowatt hour).

In other aspects a method is provided by which a first entity controls energy usage of a second entity. The method may include one or more of the steps of: determining an anticipated energy load at a second entity location based on a power rating of a plurality of energy usage devices at the second entity location and historical usage of an energy supply from a utility at the second entity location; installing at the second entity location a plurality of modules each coupled to at least one of the energy usage devices and the energy supply, each module configured to monitor and control energy usage of the electrical power supply by the corresponding at least one energy usage device, the installing performed at the direction of the first entity; connecting the plurality of modules to a network such that the plurality of modules send and receive data via said network from a remote server controlled by the first entity, the installing performed at the direction of the first entity; executing on the remote server a monitoring and control program which sends and receives the data such that data received includes information indicative of electrical power usage of at least one of the plurality of modules and data sent includes information indicative of a control input for at least one of the plurality of modules to remotely modify an energy usage thereof based on the data received; wherein the energy supply is obtained by the first entity from the utility and used by the second entity at the second entity location such that the first entity is either responsible or is liable to the utility company for payment a bill from the utility company for usage during a time period of the energy supply by the second entity.

In certain aspects the amount is determined irrespective of the usage during the time period. In other aspects, the first entity is liable to the second entity for payment of the bill to said utility during the time period and said second entity is liable to pay an amount to the first entity. In certain aspects, the energy supply is an electrical power supply.

Other objects of the invention and its particular features and advantages will become more apparent from consideration of the following drawings and accompanying detailed description.

BRIEF DESCRIPTION OF THE DRAWINGS

FIGS. 2A and 2B are functional flow diagrams showing additional detail of FIG. 1.

DETAILED DESCRIPTION OF THE INVENTION

Figure 1:
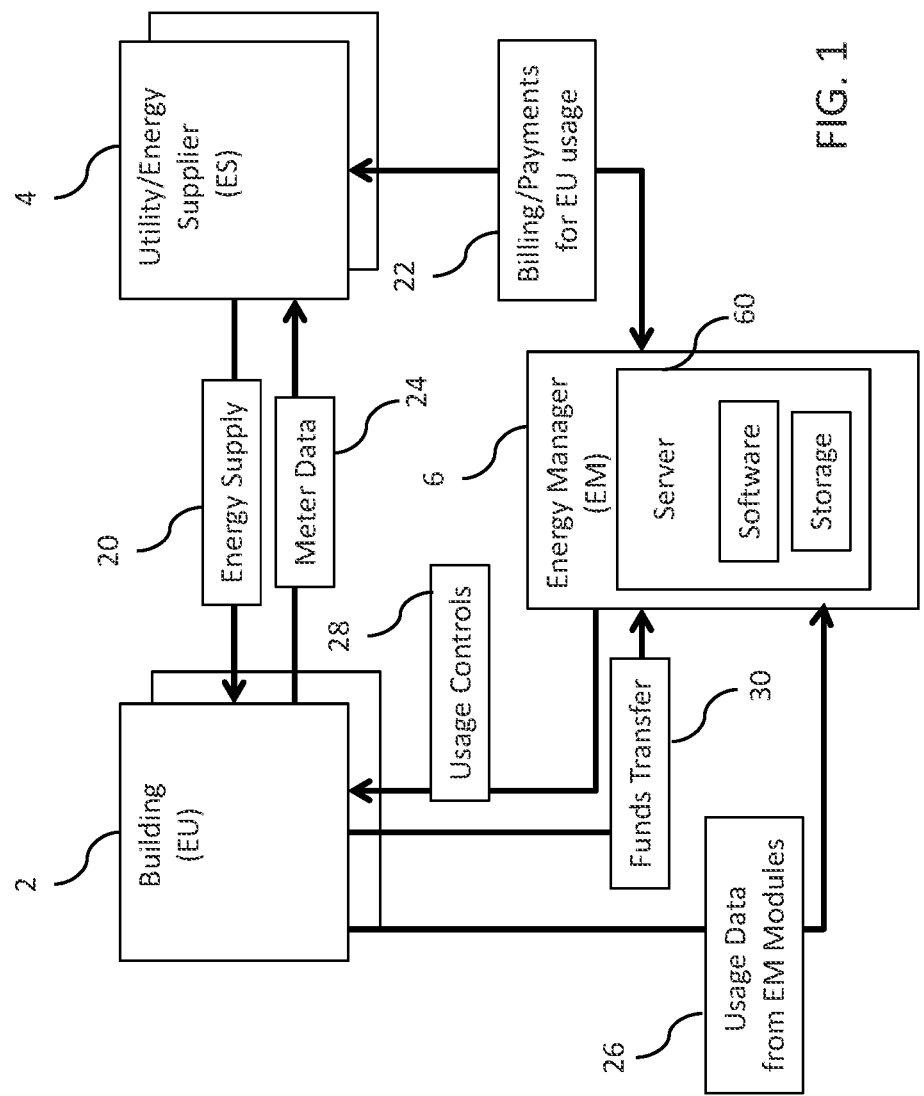
FIG. 1 is a functional flow diagram according to the present invention.

Referring now to the drawings, wherein like reference numerals designate corresponding structure throughout the views. The following examples are presented to further illustrate and explain the present invention and should not be taken as limiting in any regard.

As shown in FIG. 1, a building 2 receives an energy supply 20 from a utility/energy supplier (ES) 4. It is understood that multiple buildings 2 may be controlled and that multiple ES 4 and therefore energy supplies 20 may be provided to each building. The ES 4 may be any utility that supplies energy. For example, an electrical utility company, a natural gas supplier, a propane supplier, a fuel oil supplier, bio-fuel supplier or other energy/fuel suppliers. It is understood that with regards to electricity, there are currently charges including supplier, demand, distribution, transmission, and generation charges on most electrical bills and it is understood that the ES 4 encompasses all of these charges and other charge models. The ES 4 will typically receive meter data 24 which is the basis for billing for the energy supply 20. This meter data 24 may be from electrical meters, gas meters or other flow meters for other fuels. In the case of electrical or gas meters, the meter data 24 is often communicated to the ES 4 via electronic means such as telephone lines, wireless communications or other electronic communication methods. In the case of a flow meter such as one on a gas/oil/fuel delivery truck, this information may be communicated to the ES from the delivery truck operator.

The energy manager 6 has modules installed at the building 2. See FIG. 2 for further detail on the modules. These modules provide for wireless communications on granular levels for energy consuming devices connected to the energy supply 20. Usage data 26 captured by the modules in the building 2 is sent to the energy manager (EM). It is understood that the EM may include various servers, computers, databases, analytics, algorithms, and storages with software programs executing thereon which process the usage data 26 to determine appropriate usage controls 28 which are sent to the building 2 and the particular modules therein. The ES sends invoices to the EM which then processes and pays for the energy usage by the building 2. The building 2 (or the entity owning/leasing the building or its spaces) transfers funds 30 to the EM.

The building 2 has a variety of devices installed therein which use energy such as devices 42 and 42'. These may be selected from a wide variety of devices such as, for example, hot water heaters, heaters, furnaces (gas/electric/oil etc), HVAC equipment, lighting, appliances, cooking equipment, refrigeration equipment, machinery, computers/screens and the like. It is understood that this list is not exhaustive or limiting. As shown in FIG. 2, the devices 42, 42' are connected to respective modules 38, 38'. These modules are configured to monitor and control energy usage. Some examples of modules that could be used are described in U.S. Pat. Nos. 8,140,279, 8,396,608, 8,798,801, and U.S. Pat Publication Nos 2013-0144453 A1 and 2017-0199503-A1 the content of which is incorporated by reference herein. In one implementation, module 38 is an in-wall or overlay outlet that communicates over a network connection to a server managed by the EM 6. The module 38 further receives commands from the server to control energy usage via the module 38. This may be done by turning off power to the device 42. Alternately, the module 38 may be configured to directly control the device's settings in a way to reduce but not completely stop energy usage. By way of example, if the device 42 is an air conditioner, the temperature setting may be increased or time between cycles increased by module 38 such that the device 42 does not operate as long or as intensive, which would in turn reduce power consumption. The module 38 may also communicate with other modules to reduce peak usage, for example, by running air conditioning units at different times so that all units are not running all at once. This may reduce the cost of energy due to the peak amount used being below a threshold level. In other implementations, the module 38 is a light switch that either dims or turns off lights as necessary to reduce energy demands. The module may communicate with the device's internal controller to modify energy usage or the module may replace the device's internal controller. By way of another example, if the device 42 is a hot water heater, the temperature setting of the water reservoir may be decreased such that the device 42 does not operate as long or as intensively to keep water at the appropriate temperature, which would in turn reduce power consumption. The module 38 may also communicate with other modules to reduce peak usage, for example, by running hot water heating cycles at different times so that all units are not running all at once. This may reduce the cost of energy due to the peak amount used being below a threshold level. It is understood that these are but a few examples of how the modules can implement control of energy usage of their connected device.

In addition to controlling energy usage, module 38 also monitors energy usage of the connected device. This data is communicated over a network to the EM 6. In the implementation shown in FIG. 2, facility controller 36 communicates with the modules 38, 38' over a local network, such as a local wireless network or a wired network or combinations thereof. In some implementations, Bluetooth or WiFi communications are used to send/receive data/commands between the modules and the facility controller 36. The facility controller 36 is connected to the server 60 associated with EM 6 over a network. The control commands are generated by the EM 6 and are implemented via or by the facility controller 36. For example, the facility controller 36 may be programmed with software which implements various control parameters to control energy usage and the parameters may be modified remotely by the EM 6 and the software executing thereon. Alternately, the EM software that executes on the server 60 associated with the EM communicates control commands to the modules via the facility controller 36 (See FIG. 2b). In this embodiment, a wireless router 37 may be used to allow the controller 36 to communicate with the modules 38/38' etc. In either case, the EM 6 would control how the energy usage of the building 2 is modified via the modules.

As is also seen, the building 2 is provided with a circuit panel 34 which includes a number of circuits and breakers. Although two separate wires are shown running from the panel to the devices via the modules, it is understood that a single circuit (breaker) may have multiple modules thereon. For example, circuits that have multiple switches/outlets thereon. Thus, the granularity of energy usage and control can be on a device by device level rather than a circuit by circuit level. However, it is also contemplated that in certain embodiments, the actual circuit may be controlled/monitored directly. In yet another embodiment, control can wirelessly communicate directly with the equipment itself through a control device on the equipment, and turn either part of that equipment off and on, or turn the entire equipment load off or on to enable a demand reduction or usage curtailment. The ES 4 supplies power to the breaker panel 34 via a meter 40. The utility company, such as the electric company in the specific embodiment shown, typically supplies this meter which communicates meter data 24 to the ES 4 such that billing can be accomplished based on usage. In addition to this meter 40, a second meter 32 is installed to communicate with facility controller 36 such that overall energy usage can be monitored. This second meter 32 may monitor current through the supply to the panel 34. In certain cases, not all outlets are configured to be the modules that control, monitor and communicate energy usage. For example, conventional outlets may be used in certain locations where infrequent or limited usage is expected. This allows the EM to monitor overall usage as well and determine if additional modules need to be installed to enable granular usage/control. For example, if the conventional outlets normally account for less than 5-10% of usage, they may remain conventional outlets, but if usage increases or anomalies in usage start occurring, the EM may install additional modules to control this usage.

As an additional option, renewable energy sources such as solar 22 or others (wind etc.) may be employed to reduce energy costs. It is understood that although a solar panel 222 is shown, solar and other renewables may also employ battery and inverter 320 technology so that excess renewable energy can be stored and then used at appropriate times. These appropriate times can be determined both by when energy is available, i.e. when it is sunny and using solar, and when it is most needed ie during peak demand periods when solar energy stored in batteries can be leveraged to offset usage.

Furthermore, it is possible that two meters 40 are used in the system. In this embodiment, one meter would be used to track the amount of energy fed from solar 222 back into the grid 4 and the second meter (e.g. the existing meter) would be used to monitor incoming energy from the grid 4. In both cases, it may be the utility company who monitors the meter to determine the net amount of energy used by the building 2. For example, if solar energy is more than what is required, the outbound meter would result in a net negative energy usage, but if less solar is generated a net positive energy usage from the grid. Thus the combination of the two meters allows the utility to monitor outbound and inbound energy. It is also contemplated that one specialized meter could handle both. The EM 6 can also monitor these meters 40 to verify usage and credits and track utility charges and make appropriate control decisions. In the embodiment of two meters, the battery may or may not be employed. It is understood that since the battery stores DC energy an inverter is employed to convert to AC.

In addition to renewable energy sources, the system may also include voltage regulators and inverters to supply the required voltage to the panel 34. For example, at night when solar panels do not produce energy. Additional modules can be configured to enable switching between the renewable sources and the ES 4 supply. This switching can also be controlled by the EM via the EM software and/or control instructions/parameters sent to or implemented by the facility controller 36. Alternately, if electrical heating is available, electric heat may be used. For example, electrical that is generated by solar/renewables, may be less expensive than the other heating sources available. If electric heat from solar is more cost effective than natural gas/oil etc, the EM may implement controls to use electric heat instead of combustion based heat to heat the building but only when solar (or another renewable) is available to produce lower cost electricity. As one example, stored energy from solar may be useful for night and more expensive than gas/oil etc for the overnight heating needs, however, when a location opens in the morning, ovens may be turned on and require significant electrical power such that even if it were more cost effective to use electric heat at night, the needs for electricity in the morning may be more expensive such that it is actually more efficient to use combustible heating overnight in view of expected usage of electricity in the morning. These control logic systems can be implemented by the EM automatically by the control software.

The pricing model for the EM to charge the EU is established via an estimation process and a site survey to see the existing equipment as well as understand the complexity and methods by which new equipment can be installed as needed. The type of equipment which would be most beneficial is also weighed into the equation based on environmental factors. For example, a roof that faces the sun in a warm climate may be ideal for solar energy installations. As another example, an environment with roof access may be ideal for roof mounted equipment where as a basement installation may require a different approach.

The estimation process is primarily based on the facility size and the annual energy spend. The algorithm used makes some assumptions on percentage of use of the energy on HVAC, Lighting, and other plug in devices but can be modified based on either knowledge of the site in particular or the site survey. Examples where modification may be necessary would be in a manufacturing facility where for example large ovens are used for baking. Other high powered machinery would also offset the standard split of energy use across categories and should be adjusted for in adapting the model. The values are also adjusted based on recent upgrades. For illustration purposes, say a typical split in an office environment would be 35% for HVAC, 30% for lights, and the remaining 35% for plug in devices.

If for example the company has recently done an HVAC upgrade, it may be possible to see (either through bill analysis of through estimation) that the HVAC component would now only represent 30% due to more efficient units. Further in this illustration if the facility has recently changed to LED lighting, it can be possible to see (or calculate through historical usage values) that the lighting component is now down to 20%. With these changes, the remaining 50% would be allocated to the plug in devices. Overall, these savings are the savings obtained solely by changing out units and devices to more efficient ones without any change or adaptation in usage patterns or control.

Continuing with the model, the Third Party Energy management system, knowing the values above would set an expectation about what a reasonable additional percentage of savings in each of the above categories (HVAC, Lighting, and Plug devices) would be. Depending on what is found in the survey and in the recent updates, the number would vary considerably. If for example a new top of the line HVAC system was recently installed with smart thermostats and motion sensors, this may suggest that there is little to nothing that can be saved on the HVAC component. Similarly, if new LED lights were installed but without motion sensors or other controls that can vary brightness one might decrease the expected savings to a smaller value, say a 10% savings.

The savings are calculated based on known elements in the system mapped against the optimal savings model that is used for the site topology being considered. All three of the categories are thus analyzed and an expected percentage of savings is determined and applied. The assumptions made in the model are based on hardware costs which are required to adapt the existing site to the optimal site and would include components such as thermostats, smart plugs and power strips among other things.

However, when the EM determines how to charge the EU for the utility usage by the EU (which is controlled by the EM), the charge to the EU is not based upon the actual usage for the given billing period. The charge might increase if the prevailing rate per KWh increases, but if the EU uses more than the anticipated KWh amount, the charge would not increase unless a threshold is surpassed indicating severe modifications to increase usage patterns. However, since the EM is controlling usage by the EU through various networked switches and devices, the EM can reduce the EU's usage to save more than compared to the traditional ESCO model. The EM is responsible to pay for the EU's usage and in fact is obligated to pay the EU's usage as determined and charged by the ES.

It should also be noted that energy costs are often variable and these controls and decision making protocols may be implemented in a dynamic nature to take these considerations into effect. One can dynamically or in real time adjust the supply source and the mix of energy supply based on cost at a supplier level as well as an energy source material level and the EM can manage this through various controllers.

It is understood that when usage of other energy sources is employed, for example natural gas, the meter 4 may be a flow meter which determines the amount of natural gas used and the module 38 may control usage of this other energy source by turning on/off flow of the gas/oil etc or by modifying the control settings of the device or internal controller thereof. As but one example, this may include increasing the furnace cycle time so that if the heat is set at 72 that the furnace would allow a larger variance in measured temperature before turning on. Or, temperature may be reduced at appropriate times, for example at night when people are not at the office/using the building.

The systems are implemented whereby the EM (and/or its contractors) install the modules and features described herein in the relevant facility that uses energy. The EM then becomes responsible for paying for the EU's usage as measured by the ES meter. The EM will then implement controls to stop, curtail or otherwise modify energy usage on a module by module level as appropriate given the needs of users of the relevant facility. A portal is supplied allowing users who may be associated with the EU and/or EM to login and adjust/override various controls/settings and/or schedules of the individual modules. Additional preferences may be set to enable response to demand events, for example those where demand can be curtailed to keep peak demand below set thresholds where energy becomes more expensive.

The EM may also install/replace other systems, devices to provide for reduced energy demand. For example, heating systems such as unique nanowire based heating systems may be installed to provide a easy to install paint that acts as a resistive heater, typically using Direct Current. Other types of electrical heating systems may also be used. Solar, wind, battery and other renewable based systems may be installed. Efficient lighting such as LED lights may replace existing lights. Further, other contact and wiring methods may be used, including but not limited to re-wiring or nanowire based paint, films or the like which are applied to walls and operate on low voltage direct current. Insulation can also be installed. The EM is then paid by the EU a monthly fee that reflects a guaranteed discount relative to the EU's prior usage history and expense. The EM in turn pays the ES and becomes responsible to the ES for the EU's usage. In fact, the EM can be liable to the EU for payment of the ES charges. The EM implements controls that reduce the EU's usage, preferably so that the payments from the EU to the EM are more than the payments due to the ES and the costs of capital improvements to the EU facility. In this way, the EU has reduced usage/expense relative to the setup prior to implementation of the modules etc and the EM managed the usage and retains a portion of the overall savings with another portion of the savings passed onto the EU. The foregoing is enabled, however, by the fact that the EM is supplying the modules which allow the EM to have visibility and control over usage by the EU of utilities supplied by the ES.

Figure 3:
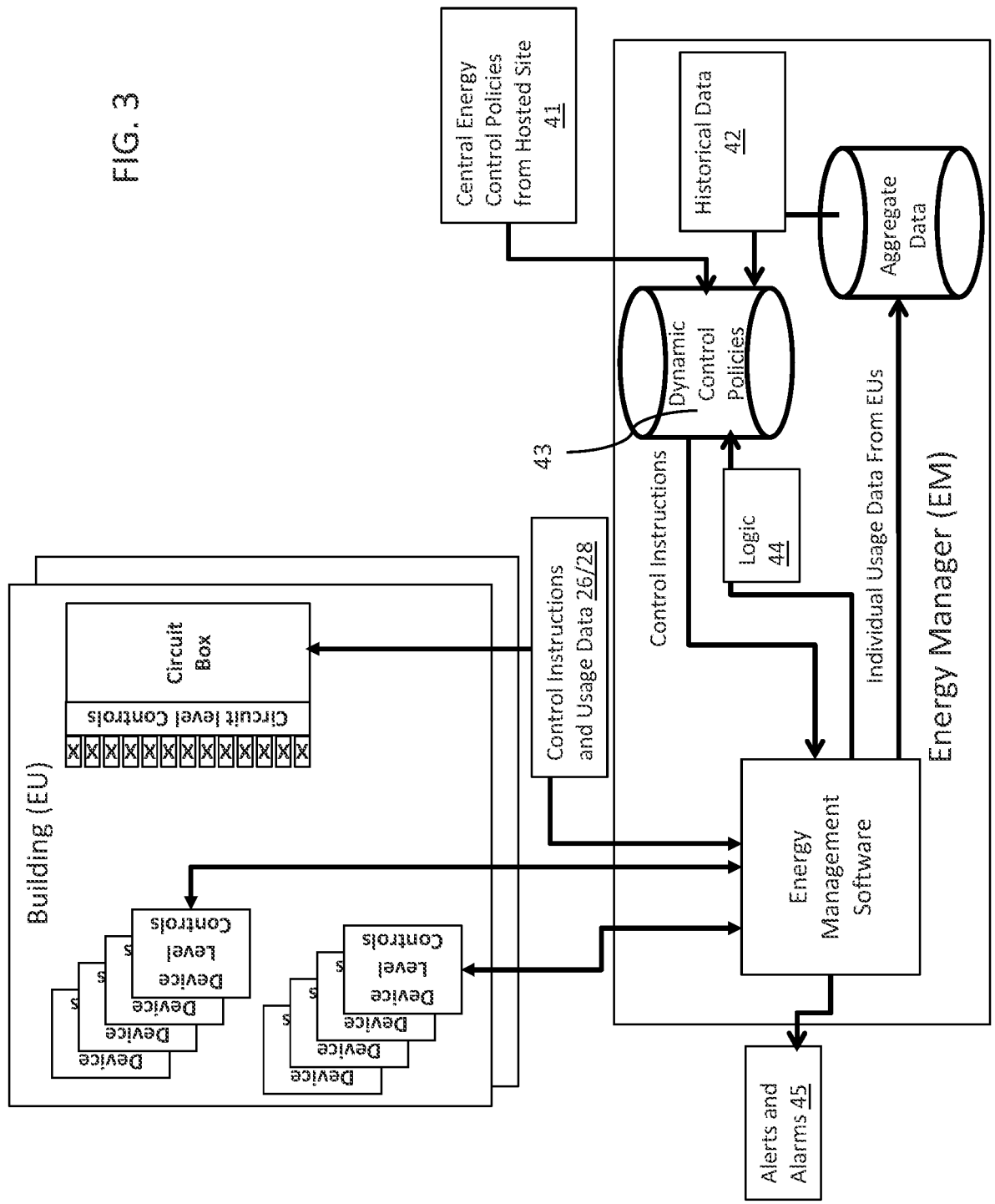
FIG. 3 is a functional flow diagram showing additional features of FIG. 1

Turning now to FIG. 3 Energy Control policies 41 and Historical Data 42 can be utilized along with logic 44 to form dynamic control policies 43. These policies adapt using the supplied data and the logic to make customized and efficient real time cost savings and efficiency related decisions when it comes to managing the devices and circuits in the EU Central energy policies 41 may include, for example, how many minutes after the shift starts or the shift ends to turn on or off heating and cooling units. These may include master temperature settings, master controls as to whether or not to shut off and restart hot water heaters after shifts etc. These master policies are stored on a hosted site and may be used to provide a uniform approach to multiple buildings in a multi-building enterprise. It can also bring additional external data into the equation such as possible upcoming storms, weather forecasts, Historical data 42 includes, for example, data relating to power consumption from historical usage, it also relates to historical readings for things like temperature variance and seasonality, it can also include response to control functions such as how long it takes or rooms to warm up or cool down when controls are sent.

Logic 44 from the energy management software combines the data and formulates control instructions which are then fed to the individual devices or circuit level controllers to cycle devices on/off or limit current of flow to these as necessary.

In some cases, human intervention may be required, and the system provides alerts and alarms 45 to generate these to a dispatcher or a technician as the case maybe. The deliver method could be a loud audible sound, an alarm, or a text message or email or other form of alert.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A system which enables a first entity to control energy usage of a second entity comprising:
   a plurality of modules installed at a second entity location
      each of the plurality of modules electrically coupled to at least one energy usage device and an electrical power supply from a utility, the utility being separate and distinct from the first and second entities;
   each one of the plurality of modules electrically coupled to the at least one energy usage device;

a network, said plurality of modules connected to a remote server controlled by the first entity via said network, said plurality of modules sending data via said network, said data indicative of usage of said electrical power supply by the at least one energy usage device to which the module is electrically coupled;

software executing on said remote server which sends a control input to modify electrical energy usage by the second entity wherein the electrical energy usage modified by the control input is associated with an energy usage device coupled to at least one of the plurality of modules;

wherein said electrical power supply is delivered from the utility and used by said second entity at the second entity location and the first entity is responsible for payment for usage of said electrical power supply by said second entity during a time period and the second entity is charged by the first entity for usage of said electrical power supply during the time period without regard to an amount of usage of said electrical power supply during the time period.

2. The system of claim 1 wherein said first entity is liable to said second entity for payment to the utility based on meter readings by the utility at the second entity location.

3. The system of claim 2 wherein the plurality of modules are positioned electrically between a meter and the at least one energy usage device wherein the meter readings are obtained from the meter.

4. The system of claim 1 further comprising:
a renewable energy generation source installed at the second entity location to reduce net usage of said electrical power supply.

5. The system of claim 4 wherein said control instructions result in energy being drawn from both said electrical power supply and said renewable energy generation source.

6. The system of claim 4 further comprising:
a second controller configured to modify use of a combustion based energy source based on instructions from said remote server to reduce use of the combustion based energy source and increase use of said renewable energy generation source.

7. The system of claim 1 wherein the control input is an alert for delivery to a technician.

8. A method by which a first entity controls energy usage of a second entity comprising:
installing at a second entity location a plurality of modules each electrically coupled to at least one energy usage device and an electrical power supply from a utility, the utility being separate and distinct from the first and second entities, each module configured to monitor energy usage of the electrical power supply by the corresponding at least one energy usage device;
connecting the plurality of modules to a network such that the plurality of modules send data via said network to a remote server controlled by said first entity;
executing on said remote server a monitoring and control program which sends and receives the data such that data received includes information indicative of electrical power usage of a first one of the at least one of the energy usage devices coupled to the at least one of the plurality of modules and data sent includes information indicative of a control input for at least the first one of the at least one energy usage device to modify an energy usage thereof based on the data received;
wherein said electrical power supply is used by said second entity at the second entity location and said first entity is either responsible or is liable to said utility for payment of a bill from said utility for usage during a time period of said electrical power supply by said second entity, said first entity is liable to said second entity for payment of the bill to said utility during the time period and said second entity is liable to pay an amount to the first entity that is determined irrespective of the usage during the time period.

9. The method of claim 8 further comprising:
installing a renewable energy generation source at the second entity location to reduce net usage of said electrical power supply.

10. The method of claim 9 wherein said control instructions result in energy being drawn from both said electrical power supply and said renewable energy generation source.

11. The method of claim 9 further comprising:
a second controller configured to modify use of a combustion based energy source based on instructions from said remote server to reduce use of the combustion based energy source and increase use of said renewable energy generation source.

12. The system of claim 8 wherein the control input is an alert for delivery to a technician.

13. A method by which a first entity controls energy usage of a second entity comprising:
determining an anticipated energy load at a second entity location;
installing at the second entity location a plurality of modules each coupled to at least one of the energy usage devices and an energy supply delivered by a utility, each module configured to monitor energy usage of the electrical power supply by the corresponding at least one energy usage device, said installing performed at the direction of said first entity, said utility being separate and distinct from the first and second entities;
connecting the plurality of modules to a network such that the plurality of modules send data via said network to a remote server controlled by said first entity;
executing on said remote server a monitoring and control program which sends and receives the data such that data received includes information indicative of electrical power usage of at least one of the plurality of modules and data sent includes information indicative of a control input to modify an energy usage of the at least one energy usage device based on the data received;
wherein said electrical power supply is used by said second entity at the second entity location and said first entity is either responsible or is liable to said utility for payment of a bill from said utility for usage during a time period of said electrical power supply by said second entity, said first entity is liable to said second entity for payment of the bill to said utility during the time period and said second entity is liable to pay an amount to the first entity that is determined irrespective of the usage during the time period.

14. The method of claim 13 wherein the amount is determined irrespective of the usage during the time period.

15. The method of claim 14 wherein said first entity is liable to said second entity for payment of the bill to said utility during the time period and said second entity is liable to pay an amount to the first entity.

16. The method of claim 14 wherein said energy supply is an electrical power supply.

17. The method of claim 13 wherein said first entity is liable to said second entity for payment of the bill to said utility during the time period and said second entity is liable to pay an amount to the first entity.

18. The method of claim 13 wherein said energy supply is an electrical power supply.

19. A method by which a first entity controls energy usage of a second entity comprising:
   determining an anticipated energy load at a second entity location;
   installing at the second entity location a plurality of modules each coupled to at least one of the energy usage devices and an energy supply from a utility, each module configured to monitor and control energy usage of the electrical power supply by the corresponding at least one energy usage device, said installing performed at the direction of said first entity;
   connecting the plurality of modules to a network such that the plurality of modules send and receive data via said network to and from a remote server controlled by said first entity;
   executing on said remote server a monitoring and control program which sends and receives the data such that data received includes information indicative of electrical power usage at the at least one of the plurality of modules and data sent includes information indicative of a control input for at least one of the plurality of modules to remotely modify an energy usage thereof based on the data received;
   wherein said electrical power supply is used by said second entity at the second entity location and said first entity is either responsible or is liable to said utility for payment of a bill from said utility for usage during a time period of said electrical power supply by said second entity, said first entity is liable to said second entity for payment of the bill to said utility during the time period and said second entity is liable to pay an amount to the first entity that is determined irrespective of the usage during the time period.

20. The method of claim 19 further comprising:
   a meter from which meter readings are obtained for the utility for purposes of determining the bill from said utility during a time period for which the first entity is either responsible or liable for payment of, and wherein the plurality of modules are positioned electrically between the meter and the at least one energy usage device.

21. The method of claim 20 wherein said first entity is liable to said second entity for payment of the bill to said utility during the time period and said second entity is liable to pay an amount to the first entity.

* * * * *